(12) United States Patent
Cheng et al.

(10) Patent No.: US 7,339,465 B1
(45) Date of Patent: Mar. 4, 2008

(54) VEHICLE-TO-TRAILER LIGHT CONNECTION VERIFICATION TESTER

(76) Inventors: John C. Cheng, 768 S. Turnbull Canyon Rd., City of Industry, CA (US) 91745; Zhen Qiu Huang, 768 S. Turnbull Canyon Rd., City of Industry, CA (US) 91745

( * ) Notice: Subject to any disclaimer, the term of this patent is extended or adjusted under 35 U.S.C. 154(b) by 194 days.

(21) Appl. No.: 11/243,698

(22) Filed: Oct. 6, 2005

(51) Int. Cl.
*G08B 29/00* (2006.01)
(52) U.S. Cl. ............... 340/514; 340/431; 307/10.8
(58) Field of Classification Search ............ 340/514, 340/431, 458, 468; 307/10.8
See application file for complete search history.

(56) References Cited

U.S. PATENT DOCUMENTS

| | | | | |
|---|---|---|---|---|
| 5,030,938 A | * | 7/1991 | Bondzeit | 340/431 |
| 5,086,277 A | * | 2/1992 | Hammerly | 324/504 |
| 5,389,823 A | * | 2/1995 | Hopkins et al. | 307/10.1 |
| 5,498,910 A | * | 3/1996 | Hopkins et al. | 307/10.1 |
| 5,990,788 A | * | 11/1999 | Syracuse | 340/458 |
| 6,218,952 B1 | * | 4/2001 | Borland et al. | 340/641 |

* cited by examiner

*Primary Examiner*—Phung T. Nguyen
(74) *Attorney, Agent, or Firm*—Albert O. Cota

(57) ABSTRACT

A vehicle-to-trailer light-connection verification tester (10) designed to be located within a towing vehicle (20), a towed trailer (30) or within a cable adapter (24) that is connected between the vehicle (20) and the trailer (30). The tester (10) features an electronics circuit (12) that includes a plug (P1), a receptacle (J2), a three-position mode switch (S1), a plurality of isolation diodes (D1-D4), and a loudspeaker (LS1). The mode switch (S1) has a vehicle test position V, a trailer test position T, and a normal lighting position N. When the switch (S1) is in the vehicle test position the rear vehicle lights are tested and when the switch (S1) is in the trailer test position (T) the rear trailer lights are tested. If each light in either the vehicle (20) or the trailer (30) is operational the loudspeaker (LS1) produces an audible sound. Conversely, if a particular light is not functioning no sound is heard. Thus, if there is a lighting problem a determination can be easily made if the problem is in the vehicle or in the trailer.

17 Claims, 3 Drawing Sheets

VEHICLE-TO-TRAILER LIGHT CONNECTION VERIFICATION TESTER

TECHNICAL FIELD

The invention pertains to the general field of electrical continuity testers and more particularly to a vehicle-to-trailer light connection verification tester that produces an audible sound when each of the rear trailer lights are correctly connected to the corresponding rear vehicle lights.

BACKGROUND ART

The pulling of various types of trailers by a vehicle is in common practice. Typically, the vehicle has attached to its rear structure a hollow receiver and the trailer has an insert that is inserted into the receiver and locked in place. Alternatively, the vehicle has attached to its rear structure a ball receiver that is designed to accept a concave ball hitch located on the trailer. In either trailer hitching means, an electrical cable assembly, with or without a cable adapter, is utilized to electrically connect the set of trailer lights to the set of corresponding vehicle lights. The set of lights typically includes a right turn light, a left turn light, a pair of brake lights, a pair of tail lights and a pair of reverse lights.

To verify that an electrical light circuit connection has been made between the vehicle and the trailer, the prior art utilizes a series adapter that incorporates a set of LEDs. If the LEDs illuminate the trailer lights are correctly connected to the corresponding vehicle lights. Conversely, if the LEDs do not illuminate there is a problem with the vehicle-to trailer lighting circuit. The problem with this verification technique is that the driver or passenger must be near the adapter to visually determine if the LEDs are or are not illuminating. Also, to check the brake lights, a first person must depress the vehicle's brake pedal while a second person observes if the LED corresponding to the brake light has or has not illuminated. In contrast, the applicant's light-connection verification technique, in lieu of a visual alert, utilizes an audible sound that can be easily heard from within the cab of the vehicle.

A search of the prior art did not disclose any patents that read directly on the claims of the instant invention, however the following U.S. patents are considered related:

| U.S. PAT. NO. | INVENTOR | ISSUED |
| --- | --- | --- |
| 5,498,910 | Hopkins, et al | 12 Mar. 1996 |
| 5,389,823 | Hopkins, et al | 24 Feb. 1995 |

Both the U.S. Pat. No. 5,498,910 and the U.S. Pat. No. 5,389,823 patents issued to Hopkins, et al, disclose an electrical circuit for adapting the independent brake lights and turn signal lights on a towing vehicle to the combined brake and turn signal lights on an associated trailer. An isolation network and a first CMOS exclusive OR integrated circuit are connected between the right turn signal light connection and brake light connection of the towing vehicle and the combined right turn signal and brake light connection on the trailer. An isolation network and a second CMOS exclusive OR integrated circuit are similarly connected between the left turn signal light connection and brake light connection of the towing vehicle and the combined left turn signal and brake light connection on the trailer. The isolation network prevents feedback from the electrical lighting system of the trailer to the electrical lighting system of the towing vehicle.

In addition to the above patents, industry literature was found that disclosed an adapter that utilizes a set of LEDs to determine if the trailer lights are correctly connected to the vehicle lights. If the LEDs illuminate, the trailer lights are correctly connected. If the LEDs do not illuminate there is a problem with the light circuit. The prior art adapter is manufactured by the Hopkins Manufacturing Corporation, U.S.A.

DISCLOSURE OF THE INVENTION

The vehicle-to-trailer light connection verification tester utilizes an electronics circuit which functions in combination with a towing vehicle and a towed trailer. The towing vehicle includes a receptacle (J1) having a plurality of sockets that are each connected to a like plurality of rear facing vehicle lights. The towed trailer includes a plug (P2) also having a like plurality of pins that are each connected to a like plurality of rear facing trailer lights. The electronics circuit is designed to determine if each of the lights connected on the towing vehicle or on the trailer are or are not operational. If there is a lighting problem, the tester can further determine if the lighting problem is with the vehicle lighting circuit or with the trailer lighting circuit.

The electronics circuit is comprised of:

a) a plug (P1) that interfaces with the receptacle (J1) on the vehicle and a receptacle (J2) that interfaces with the trailer plug (P2) that is connected to the trailer lights, b) a loudspeaker (LS1) having a positive (+) terminal and a negative (−), wherein the (−) terminal is connected to the plug (P1), c) a three-position mode switch (S1) that is connected between the positive (+) terminal on the switch (S1) and the receptacle (J2). When the mode switch (S1) is placed in a first position, the plurality of rear facing vehicle lights can each be tested. If a particular vehicle light under test is operational, the loudspeaker (LS1) produces an audible sound, conversely, if an audible sound is not produced, the particular vehicle light is not operational. When switch (S1) is placed in a second position the plurality of rear facing vehicle and trailer lights are removed from the test mode and placed in a normal operating mode. When the switch (S1) is placed in a third position the plurality of rear facing trailer lights can each be tested. If a particular trailer light under test is operational, the loudspeaker (LS1) produces an audible sound, conversely, if an audible sound is not produced, the particular trailer light is not operational.

In view of the above disclosure it is the primary object of the invention to produce a vehicle-to-trailer light connection verification tester that:

1. allows the rear facing lights including the brake lights on a vehicle and a trailer, to be tested by a single driver or passenger that is seated in the cab of the vehicle, and 2. determining when there is a lighting problem, if the problem is on the lighting circuit controlling the vehicle lights or on the lighting circuit controlling the trailer lights.

In addition to the primary object of the invention it is also an object of the invention to produce an invention to produce a tester that:

can be located within a vehicle, a trailer or on a vehicle cable adapter, if necessary can be easily removed from its functional location when a repair or maintenance of the tester is required, is cost effective from both a manufacturer's and consumer's point of view.

These and other objects and advantages of the present invention will become apparent from the subsequent detailed description of the preferred embodiment and the appended claims taken in conjunction with the accompanying drawings.

BEST MODE FOR CARRYING OUT THE INVENTION

The best mode for carrying out the invention is presented in terms of a preferred embodiment for a vehicle-to-trailer light connection verification tester 10 (hereinafter referred to as "tester 10"). The tester 10, as shown in FIGS. 1-5, includes an electronics circuit 12 which functions in combination with a towing vehicle 20 and a towed trailer 30. The towing vehicle 20 includes a receptacle (J1) having a set of five sockets (S1-S5). Socket (S1) is connected to a right turn light, (S2) is connected to a left-turn light, wherein (S1) and (S2) are also connected to a pair of brake lights, (S3) is connected to a pair of tail-lights, (S4) is connected to a pair of reverse lights and (S5) is connected to circuit ground. The towed trailer 30 includes a plug (P2) having a set of five pins (P1-P5). Pin (P1) is connected to a right turn light (L1), (P2) is connected to a left turn light (L2), wherein the pair of lights (L1) and (L2) also function as brake lights and are also connected to pins (P1) and (P2), (P3) is connected to a pair of tail lights, (P4) is connected to a pair of reverse lights (L4), and (P5) is connected to circuit ground.

Figure 1:
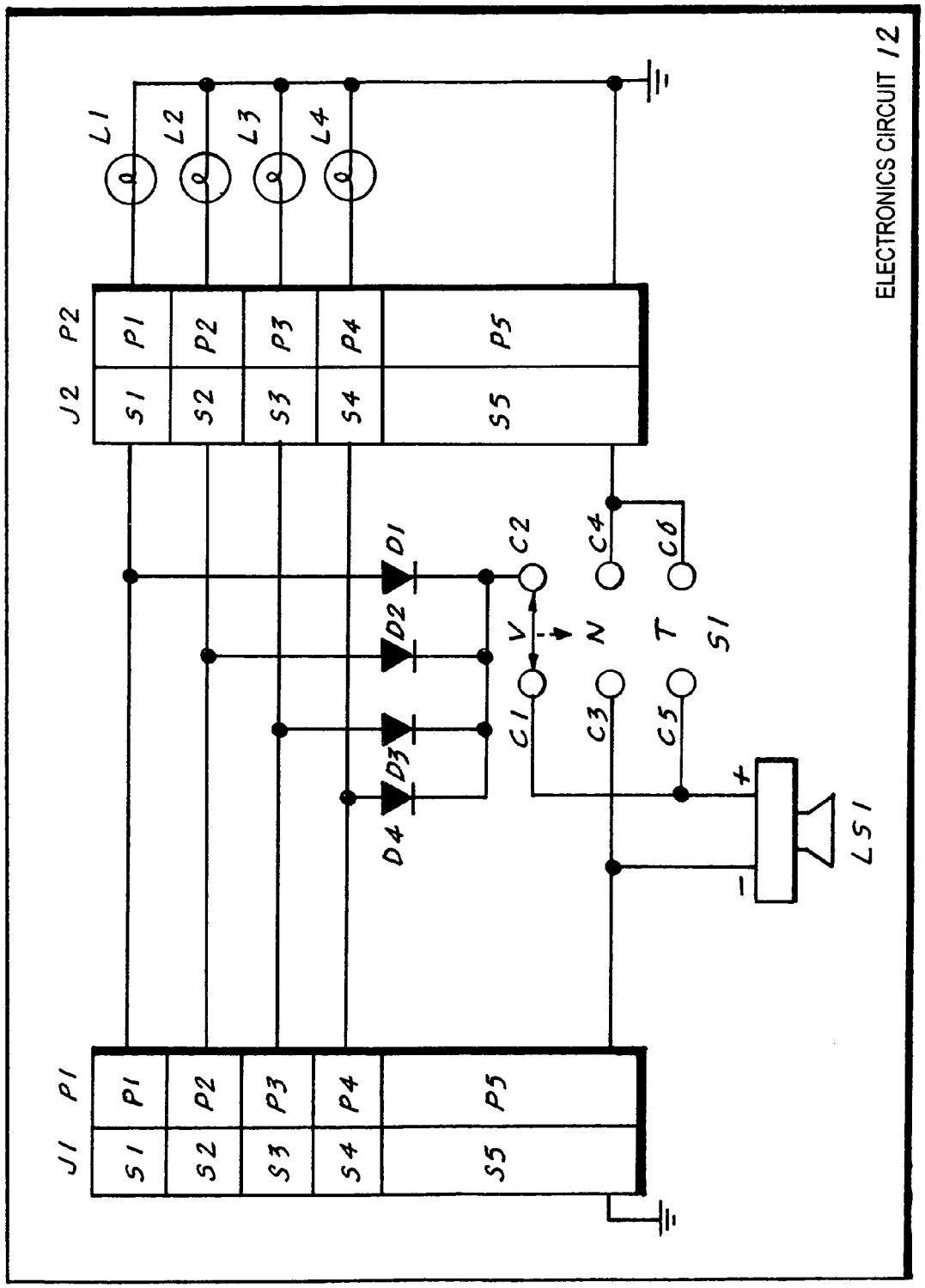
FIG. 1 is a schematic diagram of the electronics circuit that operates the vehicle-to-trailer light connection verification tester.

The electronics circuit 12, as shown schematically in FIG. 1, is comprised of five major elements: a plug (P1), a receptacle (J2), a mode switch (S1), a plurality of isolation diodes (D1-D4) and a loudspeaker (LS1).

The plug (P1) has a set of five pins (P1-P5) that interface respectively with the sockets (S1-S5) on the vehicle receptacle (J1). The receptacle (J2) also has a set of five sockets (S1-S5) that interface respectively with the plugs (P1-P5) on the trailer plug (P2). The pins (P1-P4) on the plug (P1) are respectively connected directly to the sockets (S1-S4) on the receptacle (J2). The pin (P5) on the plug (P1) is connected to socket (S5) on the receptacle (J2) via contacts (C3) and (C4) of the mode switch (S1) which is described below. Note that the receptacles (J1) and (J2) and the plugs (P1) and (P2) preferably have five sockets and five pins. However, other receptacle and socket designs can be utilized that have from four to eight pins and sockets The mode switch (S1) is comprised of a three-position switch that preferably consists of a three-position slide switch (S1) as shown in FIG. 1. The switch (S1) can also be comprised of a three-position rotary switch or a three-position toggle switch.

The first position of the switch (S1) utilizes contacts (C1) and (C2) in which position the vehicle lights are tested, the second position utilizes contacts (C3) and (C4) in which position the lights are normally operated, and position three utilizes contacts (C5) and (C6) in which position the trailer lights are tested. The contacts (C1) and (C5) are connected together and contacts (C4) and (C6) are also connected together and attached to socket (S5) on the receptacle (J2).

The plurality of isolation diodes consist of: a first diode (D1) having an anode that is connected to pin (P1) on the plug (P1) and socket (S1) on the receptacle (J2). The second diode (D2) has an anode connected to pin (P2) on the plug (P1) and socket (S2) on the receptacle (J2). The third diode (D3) has an anode connected to pin (P3) on the plug (P1) and socket (S2) on the receptacle (J2). The fourth diode (D4) has an anode connected to pin (P4) on the plug (P1) and socket (S4) on the receptacle (J2), wherein the cathodes of all four diodes (D1-D4) are connected together and attached to contact (C2) on the switch (S1).

The loudspeaker (LS1) has a positive (+) terminal and a negative (−) terminal. The (+) terminal is connected to contacts (C1) and (C5) on the switch (S1) and the (−) terminal is connected to contact (C3) on the switch (S1) and to pin (P5) on the plug (P1).

The preferred loudspeaker is preferably comprised of a piezo siren model No. MP-14-D manufactured by Minhigh Industrial Corporation located in Taiwan, R.O.C. However, any 12-volt speaker can be used that produces an audible sound having a db level that allows the sound to be heard within the confines of a vehicle cab.

The tester 10 is designed to test and verify the operation of the vehicle and trailer right turn light, the left turn light, the brake lights, the tail lights which also function as parking lights and the reverse lights. The steps required to perform the testing sequence are as follows:

A. Place the mode switch (S1) in the vehicle light test position which closes contacts (C1) and (C2), B. Activate the vehicle right turn light which then produces a voltage that is applied sequentially through socket (S1) of receptacle (J1), pin (P1) of the plug (P1), the isolation diode (D1), contacts (C2 and (C1) of the mode switch (S1), the + and − terminals of the loudspeaker (LS1), pin (P5) of the plug (P1) and socket (S5) of receptacle (J1). If the vehicle right turn light is operational the loudspeaker (LS1) produces an audible sound. Conversely, if an audible sound is not produced the vehicle right turn light is not operational, C. Activate the vehicle left turn light which then produces a voltage that is applied sequentially through socket (S2) of receptacle (J1), pin (P2) of the plug (P1), isolation diode (D2), contacts (C2) and C1) of the mode switch (S1), the + and − terminals of the loudspeaker (LS1), pin (P5) of the plug (P1) and socket (S5) of receptacle (J1). If the vehicle left turn light is operational the loudspeaker (LS1) produces an audible sound. Conversely, if an audible sound is not produced the vehicle left turn light is not operational, D. Activate the vehicle brake lights which then produces a voltage that is applied sequentially through sockets (S1) and (S2) of receptacle (J1), pins (P1) and (P2) of plug (P1), isolation diodes (D1) and (D2), contacts (C2) and (C1) of the mode switch (S1), the + and − terminals of the loudspeaker (LS1), pin (P5) of the plug (P1) and socket (S5) of receptacle (J1). If the vehicle brake lights are operational the loudspeaker (LS1) produces an audible sound. Conversely, if an audible sound is not produced the vehicle brake lights are not operational. Note that to test the brake lights utilizing the tester 10 only one person is necessary to verify the operation of the brake lights. The prior art devices require that one person press on the brake pedal while a second person visually observes if the brake light LED is or is not illuminating, E. Activate the vehicle tail lights which then produce a voltage that is applied sequentially through socket (S3) of receptacle (J1), pin (P3) of the plug (P1), isolation diode (D3), contacts (C2) and (C1) of the mode switch (S1), the + and − terminals of the loudspeaker (LS1), pin (P5) of the plug (P1) and socket (S5) of receptacle (J1). If the vehicle's tail lights are operational the loudspeaker (LS1) produces an audible sound. Conversely, if an audible sound is not produced the vehicle tail lights are not operational, F. Activate the vehicle reverse lights which then produce a voltage that is applied sequentially through socket (S4) of receptacle (J1), pin (P4) of the plug (P1), isolation diode (D4), contacts (C2) and (C1) of the mode switch (S1), the + and − terminals of loudspeaker (LS1), pin (P5) of the plug (P1) and socket (S5) of receptacle (J1). If the vehicle reverse lights are operational the loudspeaker (LS1) produces an audible sound. If an audible sound is not produced the vehicle reverse lights are not operational, G. Place the mode switch (S1) in the trailer light test position which closes contacts (C5) and (C6), H. Activate the vehicle right turn light which then produces a voltage that is applied sequentially through socket (S1) of receptacle (J1), pin (P1) of the plug (P1), socket (S1) of the receptacle (J2), pin (P1) of plug (P2), the trailer right turn light (L1), pin (P5) of plug-(P2), socket (S5) of the receptacle (J2), contacts (C6) and (C5) of the mode switch (S1), the + and − terminals of the loudspeaker (LS1), pin (P5) of the plug (P1) and socket (S5) receptacle (J1). If the trailer right turn indicating light (L1) is operational the loudspeaker (LS1) produces an audible sound. Conversely, if an audible sound is not produced the trailer right turn light (L1) is not operational, I. Active the vehicle left turn light which then produces a voltage that is applied sequentially through socket (S2) of receptacle (J1), pin (P2) of the plug (P1), socket (S2) of the receptacle (J2), pin (P2) of plug (P2), the trailer left turn light (L2), pin (P5) of plug (P2), socket (S5) of the receptacle (J2), contacts (C6) and (C5) of the mode switch (S1), the + and − terminals of the loudspeaker (LS1), pin (P5) of the plug (P1) and socket (S5) of receptacle (J1). If the trailer left turn indicating light (L2) is operational the loudspeaker (LS1) produces an audible sound. Conversely, if an audible sound is not produced the vehicle left turn light is not operational, J. Activate the vehicle brake lights which then produce a voltage that is applied sequentially through sockets (S1) and (S2) of receptacle (J1), pins (P1) and (P2) of the plug (P1), sockets (S1) and (S2) of the receptacle (J2), pins (P1) and (P2) of plug (P2), the trailer brake lights (L1 and L2), pin (P5) of plug (P2), socket (S5) of the receptacle (J2), contacts (C6) and (C5) of the mode switch (S1), the + and − terminals of the loudspeaker (LS1), pin (P5) of the plug (P1) and socket (S5) of receptacle (J1), wherein if the trailer brake lights (L1 and L2) are operational the loudspeaker (LS1) produces an audible sound. Conversely, if an audible sound is not produced the trailer brake lights (L1 and L2) are not operational, K. Activate the vehicle trail lights which then produce a voltage that is applied sequentially through socket (S3) of receptacle (J1), pin (P3) of the plug (P1), socket (S3) of the receptacle (J2), pin (P3) of plug (P2), the trailer tail lights (L3), pin (P5) of plug (P2), socket (S5) of the receptacle (J2), contacts (C6) and (C5) of the mode switch (S1), the + and − terminals of the loudspeaker (LS1), pin (P5) of the plug (P1) and socket (S5) of receptacle (J1). If the trailer tail lights are operational the loudspeaker (LS1) produces an audible sound. Conversely, if an audible sound is not produced the trailer tail lights are not operational, L. Activate the vehicle reverse lights which then produce a voltage that is applied sequentially through socket (S4) of receptacle (J1), pin (P4) of the plug (P1), socket (S4) of said receptacle (J2), pin (P4) of plug (P2), the reverse lights (L4), pin (P5) of plug (P2), socket (S5) of the receptacle (J2), contacts (C6) and (C5) of the mode switch (S1), the + and − terminals of the loudspeaker (LS1), pin (P5) of the plug (P1) and socket (S5) of receptacle (J1). If the trailer reverse lights are operational the loudspeaker (LS1) produces an audible sound. Conversely, if an audible sound is not produced the trailer reverse lights are not operational, M. Place the mode switch (S1) in the normal light operation position which closes contacts (C3) and (C4), N. Activate the vehicle right turn light which then produces a voltage that is applied sequentially through socket (S1) of receptacle (J1), pin (P1) of the plug (P1), socket (S1) of the receptacle (J2), pin (P1) of plug (P2), the trailer right turn light (L1), pin (P5) of plug (P2), socket (S5) of the receptacle (J2), contacts (C4) and (C3) of the mode switch (S1), pin (P5) of the plug (P1) and socket (S5) of receptacle (J1), O. Activate the vehicle left turn light which then produces a voltage that is applied sequentially through socket (S2) of receptacle (J1), pin (P2) of the plug (P1), socket (S2) of the receptacle (J2), pin (P2) of plug (P2), the trailer left turn light (L2), pin (P5) of plug (P2), socket (S5) of the receptacle (J2), contacts (C4) and (C3) of the mode switch (S1), pin (P5) of the plug (P1) and socket (S5) of receptacle (J1), P. Activate the vehicle brake lights which then produce a voltage that is applied sequentially through sockets (S1) and (S2) of receptacle (J1), pins (P1) and (P2) of the plug (P1), sockets (S1) and (S2) of the receptacle (J2), pins (P1) and (P2) of plug (P2), the trailer brake lights (L1 and L2), pin (P5) of plug (P2), socket (S5) of the receptacle (J2), contacts (C4) and (C3) of the mode switch (S1), pin (P5) of the plug (P1) and socket (S5) of receptacle (J1), Q. Activate the vehicle trail lights which then produce a voltage that is applied sequentially through socket (S3) of receptacle (J1), pin (P3) of the plug (P1), socket (S3) of the receptacle (J2), pin (P3) of plug (P2), the trailer tail lights (L3), pin (P5) of plug (P2), socket (S5) of the receptacle (J2), contacts (C4) and (C3) of the mode switch (S1), pin (P5) of the plug (P1) and socket (S5) of receptacle (J1), R. Activate the vehicle reverse lights which then produce a voltage that is applied sequentially through socket (S4) of receptacle (J1), pin (P4) of the plug (P1), socket (S4) of the receptacle (J2), pin (P4) of plug (P2), the reverse lights (L4), pin (P5) of plug (P5), socket (S5) of the receptacle (J2), contacts (C4) and (C3) of the mode switch (S1), pin (P5) of the plug (P1) and socket (S5) of receptacle (J1).

The tester 10 can be designed to have the electronics circuit 12 positioned in various locations. Four such locations are described below.

Figure 2:
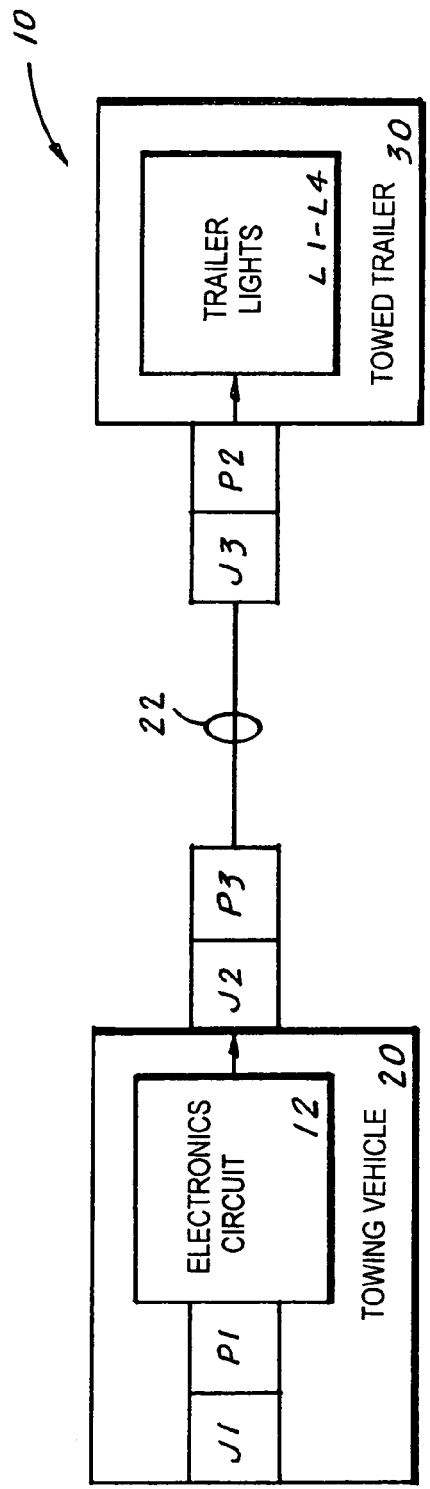
FIG. 2 is a block diagram of the tester having the electronics circuit located within an enclosure located adjacent the rear end of the towing vehicle.

In the first location, as shown in FIG. 2, the electronics circuit 12 is located within an enclosure located adjacent the rear end of the vehicle 20. In this design, the plug (P1) is connected to the receptacle (J1) and the receptacle (J2) makes contact with the plug (P2) on the towed trailer 30 by means of a cable assembly 22. The cable assembly 22 has a plug (P3) that is connected to the receptacle (J2) and a receptacle (J3) that is connected to the plug (P2) that interfaces with the trailer lights (L1-L4).

Figure 3:
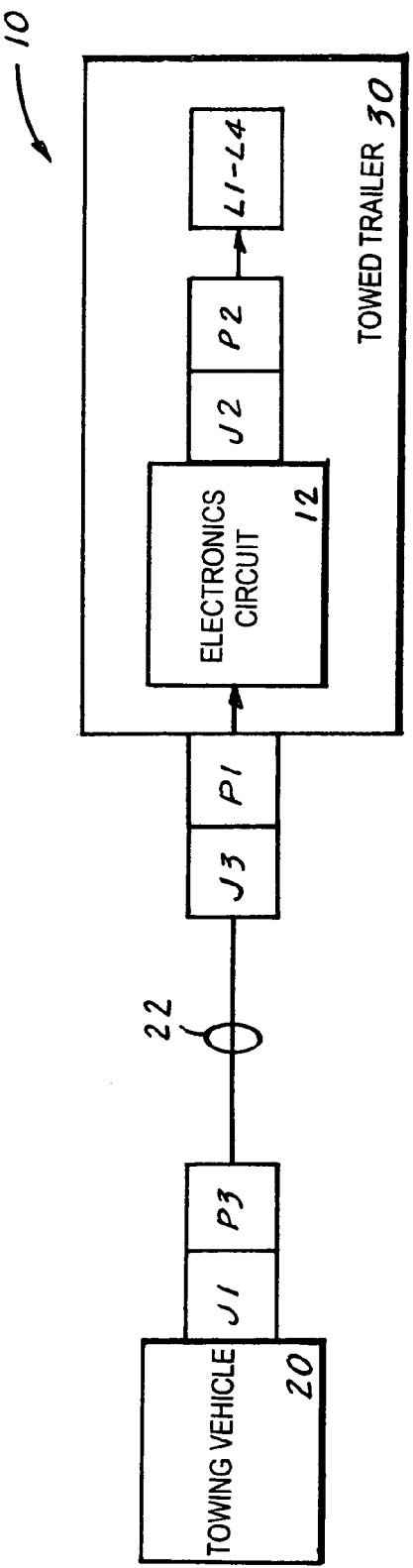
FIG. 3 is a block diagram of the tester having the electronics circuit located within an enclosure located within the confines of the towed trailer.

In the second location, as shown in FIG. 3, the electronics circuit 12 is located within an enclosure that is located within the confines of the towed trailer 30. In this design, the receptacle (J2) is connected to the plug (P2) that interfaces with the lights (L1-L4). The plug (P1) makes contact with the receptacle (J1) by means of a cable assembly 22. The cable assembly has a plug (P3) that is connected to the receptacle (J1) and a receptacle (J3) that is connected to the plug (P1).

Figure 4:
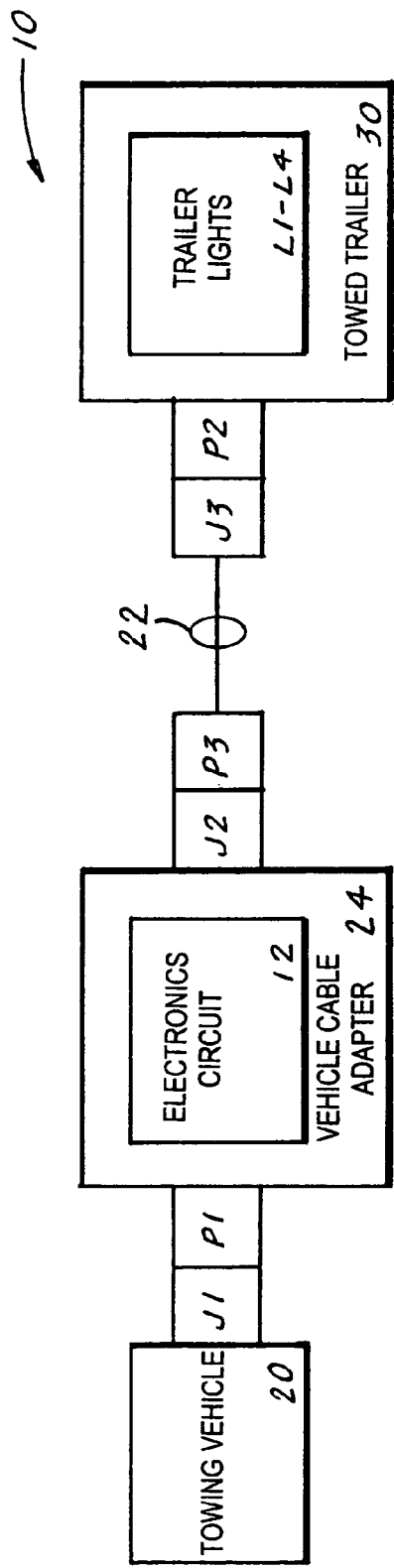
FIG. 4 is a block diagram of the tester having the electronics circuit located within a vehicle cable adapter that is connected between the towing vehicle and the towed trailer by means of a cable assembly.

In the third location, as shown in FIG. 4, the electronics circuit 12 is located within a vehicle cable adapter 24 having a plug (P1) and a receptacle (J2). The plug (P1) is connected to the receptacle (J1) and the receptacle (J2) makes contact with the plug
(P2) on the trailer 30 by means of a cable assembly 22. The cable assembly has a plug (P3) that is connected to the receptacle (J2) and a receptacle (J3) that is connected to the plug (P2) that interfaces with the lights (L1-L4).

Figure 5:
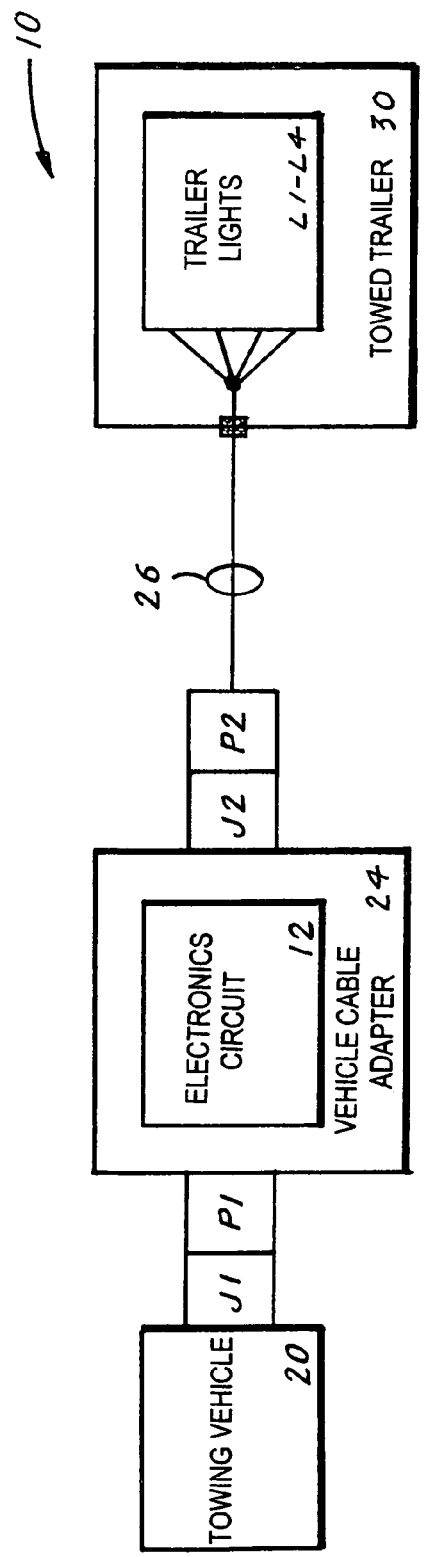
FIG. 5 is a block diagram of the tester having the electronics circuit located within a vehicle cable adapter that is connected between the towing vehicle and the towed trailer by means of a cable assembly. This figure differs from FIG. 4 in that the trailer adapter is attached to the towed trailer by a cable assembly that includes a pigtail wiring harness that extends from the front of the trailer.

In the fourth location, as shown in FIG. 5, the electronics circuit is located within a vehicle cable adapter 24 having a plug (P1) and a receptacle (J2). The plug (P1) is connected to the receptacle (J1) and the receptacle (J2) is connected to a cable assembly 26 having an outer end a plug (P2) that is connected to the receptacle (J2). The inner end of the cable assembly 26 is hard wired to a terminal board that is also connected to the lights (L1-L4).

While the invention has been described in detail and pictorially shown in the accompanying drawings it is not to be limited to such details, since many changes and modifications may be made to the invention without departing from the spirit and the scope thereof. Hence, it is described to cover any and all modifications and forms, which may come within the language and cope of the claims.

The invention claimed is:

1. A vehicle-to-trailer light connection verification tester having an electronics circuit which function in combination with a towing vehicle and a towed trailer, wherein the towing vehicle includes a receptacle (J1) having a plurality of sockets that are each connected to a like plurality of rear facing lights, wherein the towed trailer includes a plug (P2) having a like plurality of pins that are each connected to a like plurality of rear facing lights, wherein said electronics circuit having means for determining:
   a) if each of the plurality of lights connected on the towing vehicle are or not functioning,
   b) if each of the plurality of lights connected on the towed trailer are or not functioning,
   c) when there is a lighting problem, if the lighting problem is with the vehicle lighting circuit or with the trailer lighting circuit,
   d) a plug (P1) that interfaces with the receptacle (J1) on the vehicle and a receptacle (J2) that interfaces with the plug (P2) on the trailer,
   e) a loudspeaker (LS1) having a positive (+) terminal and a negative (−), wherein the (−) terminal is connected to said plug (P1),
   f) a three-position mode switch (S1) that is connected between the positive (+) terminal on said switch (S1) and said receptacle (J2), wherein when said switch (S1) is placed in:
      (1) a first position, the plurality of rear facing vehicle lights can each be tested, if a particular vehicle light is functioning, said loudspeaker (LS1) produces an audible sound, conversely, if an audible sound is not produced, the particular vehicle light under test is not operational,
      (2) the second position the plurality of rear facing vehicle and trailer lights are removed from the test mode and placed in a normal operating mode, and
      (3) the third position the plurality of rear facing trailer lights can each be tested, if a particular trailer light is functioning, said loudspeaker (LS1) produces an audible sound, conversely, if an audible sound is not produced, the particular trailer light under test is not operational.

2. The tester as specified in claim 1 wherein the plurality of vehicle and trailer lights are comprised of at least a right turn light, a left turn light, a pair of tail lights, and a pair of brake lights.

3. The tester as specified in claim 2 wherein the plurality of lights further comprises a pair of reverse lights.

4. The tester as specified in claim 3 wherein the plurality of lights further comprises a pair of parking lights.

5. The tester as specified in claim 1 wherein said loudspeaker (LS1) is comprised of a piezo siren model number MP-14D manufactured by Minhigh Industrial Corporation located in Taiwan, R.O.C., wherein the audible sound produced by said loudspeaker (LS1) is at a db level that allows the sound to be heard within the confines of a vehicle cab.

6. The tester as specified in claim 1 wherein said three-position mode switch is comprised of a slide switch.

7. The tester as specified in claim 1 wherein said electronics circuit can be designed to be located:
   a) within the confines of the vehicle,
   b) within the confines of the trailer, or
   c) within a cable adapter that is connected between the vehicle and the trailer by a connection means.

8. The tester as specified in claim 1 wherein said means for testing the operation of the vehicle and trailer right turn light, left turn light, brake lights, tail lights and reverse lights comprises the following steps:
   a) place said mode switch (S1) in the vehicle light test position which closes contacts (C1) and (C2),
   b) activate the vehicle right turn light which then produces a voltage that is applied sequentially through socket (S1) of receptacle (J1), pin (P1) of said plug (P1), said isolation diode (D1), contacts (C2) and (C1) of said mode switch (S1), the + and − terminals of said loudspeaker (LS1), pin (P5) of said plug (P1) and socket (S5) of receptacle (J1), wherein if the vehicle right turn light is operational said loudspeaker (LS1) produces an audible sound, conversely, if an audible sound is not produced the vehicle right turn light is not operational,
   c) activate the vehicle left turn light which then produces a voltage that is applied sequentially through socket (S2) of receptacle (J1), pin P2 of said plug (P1), isolation diode (D2), contacts (C2) and (C1) of said mode switch (S1), the + and − terminals of said loudspeaker (LS1), pin (P5) of said plug (P1) and socket (S5) of receptacle (J1), wherein if the vehicle left turn light is operational said loudspeaker (LS1)

produces an audible sound, conversely, if an audible sound is not produced the vehicle left turn light is not operational, d) activate the vehicle brake lights which then produces a voltage that is applied sequentially through sockets (S1) and (S2) of receptacle (J1), pins (P1) and (P2) of said plug (P1), isolation diodes (D1) and (D2), contacts (C2) and (C1) of said mode switch (S1), the + and − terminals of said loudspeaker (LS1), pin (P5) of said plug (P1) and socket (S5) of receptacle (J1), wherein if the vehicle brake lights are operational said loudspeaker (LS1) produces an audible sound, conversely, if an audible sound is not produced the vehicle brake lights are not operational, e) activate the vehicle tail lights which then produce a voltage that is applied sequentially Through socket (S3) of receptacle (J1), pin (P3) of said plug (P1), isolation diode (D3), contacts (C2) and (C1) of said mode switch (S1), the + and − terminals of said loudspeaker (LS1), pin P5 of said plug (P1) and socket (S5) of receptacle (J1), wherein if the vehicle tail lights are operational said loudspeaker (LS1) produces an audible sound, conversely, if an audible sound is not produced the vehicle tail lights are not operational, f) activate the vehicle reverse lights which then produce a voltage that is applied sequentially through socket (S4) of receptacle (J1), pin (P4) of said plug (P1), isolation diode (D4), contacts (C2) and (C1) of said mode switch (S1), the + and − terminals of loudspeaker (LS1), pin (P5) of said plug (P1) and socket (S5) of receptacle (J1), wherein if the vehicle reverse lights are operational said loudspeaker (LS1) produces an audible sound, conversely, if an audible sound is not produced the vehicle reverse lights are not operational, g) place said mode switch (S1) in the trailer light test position which closes contacts (C5) and (C6), h) activate the vehicle right turn light which then produces a voltage that is applied sequentially through socket (S1) of receptacle (J1), pin (P1) of said plug (P1), socket (S1) of said receptacle (J2), pin (P1) of plug (P2), the trailer right turn light (L1), pin (P5) of plug (P2), socket (S5) of said receptacle (J2), contacts (C6) and (C5) of said mode switch (S1), the + and − terminals of said loudspeaker (LS1), pin (P5) of said plug (P1) and socket (S5) of receptacle (J1), wherein if the trailer right turn indicating light (L1) is operational said loudspeaker (LS1) produces an audible sound, conversely, if an audible sound is not produced the trailer right turn light (L1) is not operational, i) activate the vehicle left turn light which then produces a voltage that is applied sequentially through socket (S2) of receptacle (S1), pin (P2) of said plug (P1), socket (S2) of said receptacle (J2), pin (P2) of plug (P2), the trailer left turn light (L2), pin (P5) of plug (P2), socket (S5) of said receptacle (J2), contacts (C6) and (C5) of said mode switch (S1), the + and − terminals of said loudspeaker (LS1), pin (P5) of said plug (P1) and socket (S5) of receptacle (J1), wherein if the trailer right turn indicating light (L2) is operational said loudspeaker (LS1) produces an audible sound, conversely, if an audible sound is not produced the vehicle left turn light is not operational, j) activate the vehicle brake lights which then produce a voltage that is applied sequentially through sockets (S1) and (S2) of receptacle (J1), pins (P1) and (P2) of said plug (P1), sockets (S1) and (S3) of said receptacle (J2), pins (P1) and (P2) of plug (P2), the trailer brake lights (L1 and L2), pin (P5) of plug (P2), socket (S5) of said receptacle (J2), contacts (C6) and (C5) of said mode switch (S1), the + and − terminals of said loudspeaker (LS1), pin (P5) of said plug (P1) and socket (S5) of receptacle (J1), wherein if the trailer brake lights (L1 and L2) are operational said loudspeaker (LS1) produces an audible sound, conversely, if an audible sound is not produced the trailer brake lights (L1 and L2) are not operational, k) activate the vehicle trail lights which then produce a voltage that is applied sequentially through socket (S3) of receptacle (J1), pin (P3) of said plug (P1), socket (S3) of said receptacle (J2), pin (P3) of plug (P2), the trailer tail lights (L3), pin (P5) of plug (P2), socket (S5) of said receptacle (J2), contacts (C6) and (C5) of said mode switch (S1), the + and − terminals of said loudspeaker (LS1), pin (P5) of said plug (P1) and socket (S5) of receptacle (J1), wherein if the trailer tail lights are operational said loudspeaker (LS1) produces an audible sound, conversely, if an audible sound is not produced the trailer tail lights are not operational, l) activate the vehicle reverse lights which then produce a voltage that is applied sequentially through socket (S4) of receptacle (J1), pin (P4) of said plug (P1), socket (S4) of said receptacle (J2), pin (P4) of plug (P2), the reverse lights (L4), pin (P5) of plug (P5), socket (S5) of said receptacle (J2), contacts (C6) and (C5) of said mode switch (S1), the + and − terminals of said loudspeaker (LS1), pin (P5) of said plug (P1) and socket (S5) of receptacle (J1), wherein if the trailer reverse lights are operational said loudspeaker (LS1) produces an audible sound, conversely, if an audible sound is not produced the trailer reverse lights are not operational, m) place said mode switch (S1) in the normal light operation position which closes contacts (C3) and (C4), n) activate the vehicle right turn light which then produces a voltage that is applied sequentially through socket (S1) of receptacle (J1), pin (P1) of said plug (P1), socket (S1) of said receptacle (J2), pin (P1) of plug (P2), the trailer right turn light (L1), pin (P5) of plug (P2), socket (S5) of said receptacle (J2), contacts (C4) and (C3) of said mode switch (S1), pin (P5) of said plug (P1) and socket (S5) of receptacle (J1), o) activate the vehicle left turn light which then produces a voltage that is applied sequentially through socket (S2) of receptacle (J1), pin (P2) of said plug (P1), socket (S2) of said receptacle (J2), pin (P2) of plug (P2), the trailer left turn light (L2), pin (P5) of plug (P2), socket (S5) of said receptacle (J2), contacts (C4) and (C3) of said mode switch (S1), pin (P5) of said plug (P1) and socket (S5) of receptacle (J1), p) activate the vehicle brake lights which then produce a voltage that is applied sequentially through sockets (S1) and (S2) of receptacle (J1), pins (P1) and (P2) of said plug (P1), sockets (S1) and (S3) of said receptacle (J2), pins (P1) and (P2) of plug (P2), the trailer brake lights (L1 and L2), pin (P5) of plug (P2), socket (S5) of said receptacle (J2), contacts (C4) and (C3) of said mode switch (S1), pin (P5) of said plug (P1) and socket (S5) of receptacle (J1), q) activate the vehicle trail lights which then produce a voltage that is applied sequentially through socket (S3) of receptacle (J1), pin (P3) of said plug (P1), socket (S3) of said receptacle (J2), pin (P3) of plug (P2), the trailer tail lights (L3), pin (P5) of plug (P2), socket (S5) of said receptacle (J2), contacts (C4) and (C3) of said mode switch (S1), pin (P5) of said plug (P1) and socket (S5) of receptacle (J1), and r) activate the vehicle reverse lights which then produce a voltage that is applied sequentially through socket (S4) of receptacle (J1), pin (P4) of said plug (P1), socket (S4) of said receptacle (J2), pin (P4) of plug (P2), the reverse lights (L4), pin (P5) of plug (P5), socket (S5) of said receptacle (J2), contacts (C4) and (C3) of said mode switch (S1), pin (P5) of said plug (P1) and socket (S5) of receptacle (J1).

9. The tester as specified in claim 8 wherein said three-position mode switch (S1) is comprised of a slide switch.

10. The tester as specified in claim 8 wherein said three-position mode switch is comprised of a rotary switch.

11. The tester as specified in claim 8 wherein said loudspeaker (LS1) is comprised of piezo siren model No. MP-14D manufactured by Minhigh Industrial Corporation located in Taiwan, R.O.C.

12. The tester as specified in claim 8 wherein said receptacle (J1) and plug (P1) and said receptacle (J2) and plug (P2) can be selected to include from four to eight pins and sockets.

13. The tester as specified in claim 8 wherein said electronics circuit is located within an enclosure located adjacent the rear end of the vehicle, wherein said plug (P1) is connected to the receptacle (J1), and said receptacle (J2) makes contact with the plug (P2) on the towed trailer by means of a cable assembly having a plug (P3) that is connected to said receptacle (J2) and a receptacle (J3) that is connected to the plug (P2) that interfaces with the trailer lights (L1-L4).

14. The tester as specified in claim 8 wherein said electronics circuit is located within an enclosure located within the confines of the towed trailer, wherein said receptacle (J2) is connected to the plug (P2) that interfaces with the trailer lights (L1-L4) and said plug (P1) makes contact with the receptacle (J1) by means of a cable assembly having a plug (P3) that is connected to the receptacle (J1) and a receptacle (J3) that is connected to said plug (P1).

15. The tester as specified in claim 8 wherein said electronics circuit is located within a vehicle cable adapter having a plug (P1) that is connected to the receptacle (J1) on the vehicle and a receptacle (J2) that makes contact with the plug (P2) on the trailer by means of a cable assembly having a plug (P3) that is connected to said receptacle (J2) and a receptacle (J3) that is connected to the plug (P2) that interfaces with the trailer lights (L1-L4).

16. The tester as specified in claim 8 wherein said electronics circuit is located within a vehicle cable adapter having a plug (P1) that is connected to the receptacle (J1) on the vehicle and a receptacle (J2) that is connected to a cable assembly having on outer end a plug (P2) that is connected to said receptacle (J2) wherein the inner end of said cable assembly is hard wired to a terminal board that is also connected to the trailer lights (L1-L4).

17. A vehicle-to-trailer light connection verification tester having an electronics circuit which functions in combination with a towing vehicle and a towed trailer, wherein the towing vehicle includes a receptacle (J1) having a set of five sockets (S1-S5), wherein (S1) is connected to a right turn light, (S2) is connected to a left-turn light, wherein (S1) and (S2) are also connected to a pair of brake lights, (S3) is connected to a pair of tail-lights, (S4) is connected to a pair of reverse lights and (S5) is connected to circuit ground, wherein the towed trailer includes a plug (P2) having a set of five pins (P1-P5), wherein (P1) is connected to a right turn light (L1), (P2) is connected to a left turn light (L2), wherein the pair of lights (L1) and (L2) also function as brake lights and are also connected to pins (P1) and (P2), (P3) is connected to a pair of tail lights, (P4) is connected to a pair reverse lights (L4), and (P5) is connected to circuit ground, wherein said electronics circuit comprises:

a) a plug (P1) having a set of five pins (P1-P5) that interface respectively with the sockets (S1-S5) on the vehicle receptacle (J1), b) a receptacle (J2) having a set of five sockets (S1-S5) that interface respectively with the plugs (P1-P5) on the trailer plug (P2), wherein the pins (P1-P5) on said plug (P1) are connected respectively to the sockets (S1-S5) on said receptacle (J2), c) a three-position mode switch (S1) wherein the first position utilizes contacts (C1) and (C2) in which position the vehicle lights are tested, the second position utilizes contacts (C3) and (C4) in which position the lights are normally operated, and position three utilizes contacts (C5) and (C6) in which position the trailer lights are tested, wherein contacts (C1) and (C5) are connected together and contacts (C4 and (C6) are also connected together and attached to socket (S5) on said receptacle (J2), d) a plurality of isolation diodes comprising:

(1) a first diode (D1) having an anode connected to pin (P1) of said plug (P1) and socket (S1) on said receptacle (J2), (2) a second diode (D2) having an anode connected to pin (P2) of said plug (P1) and socket (S2) on said receptacle (J2), (3) a third diode (D3) having an anode connected to pin (P3) of said plug (P1) and socket (S2) on said receptacle (J2), (4) a fourth diode (D4) having an anode connected to pin (P4) of said plug (P1) and socket (S4) on said receptacle (J2), wherein the cathodes of all four diodes (D1-D4) are connected together and attached to contact (C2) on said switch (S1), e) a loudspeaker (LS1) having a positive (+) terminal and a negative (−) terminal, wherein the + terminal is connected to contacts (C1) and (C5) and the − terminal is connected to contact (C3) on said switch (S1) and to pin (P5) on said plug (P1), and f) means for utilizing said tester to test the operation of the vehicle lights and the corresponding trailer lights.

* * * * *